(12) United States Patent
Ito et al.

(10) Patent No.: US 9,577,158 B2
(45) Date of Patent: Feb. 21, 2017

(54) PHOSPHOR SHEET-FORMING RESIN COMPOSITION

(75) Inventors: Yasushi Ito, Tochigi (JP); Yoshifumi Ueno, Tochigi (JP); Hirofumi Tani, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 14/123,534

(22) PCT Filed: Jul. 5, 2012

(86) PCT No.: PCT/JP2012/067174
§ 371 (c)(1),
(2), (4) Date: Dec. 3, 2013

(87) PCT Pub. No.: WO2013/005791
PCT Pub. Date: Jan. 10, 2013

(65) Prior Publication Data
US 2014/0097461 A1    Apr. 10, 2014

(30) Foreign Application Priority Data

Jul. 5, 2011    (JP) .................................. 2011-148820

(51) Int. Cl.
*H01L 33/50* (2010.01)
*C09K 11/02* (2006.01)
(Continued)

(52) U.S. Cl.
CPC ........... *H01L 33/502* (2013.01); *C08L 53/025* (2013.01); *C09K 11/02* (2013.01); *C09K 11/025* (2013.01);
(Continued)

(58) Field of Classification Search
CPC ......... C09K 11/00; C09K 11/02; C09K 11/08; C09K 11/025; H01L 33/50; H01L 33/501; H01L 33/502; H01L 33/505; C08L 53/025
(Continued)

(56) References Cited

U.S. PATENT DOCUMENTS 5,569,530 A    10/1996  Dooms et al.
5,789,021 A    8/1998   Dooms et al.
(Continued)

FOREIGN PATENT DOCUMENTS

CN    101896567 A    11/2010
CN    101943374 A    1/2011
(Continued)

OTHER PUBLICATIONS

International Preliminary Report on Patentability issued in International Patent Application No. PCT/JP2012/067174 dated Jan. 7, 2014 (with translation).

(Continued)

*Primary Examiner* — Cuong Q Nguyen
*Assistant Examiner* — Tong-Ho Kim
(74) *Attorney, Agent, or Firm* — Oliff PLC

(57) ABSTRACT

A phosphor sheet-forming resin composition uses a low-cost resin material having high light fastness and low visible light absorption and is capable of providing a phosphor sheet at low cost with deterioration of a phosphor due to moisture being suppressed. The phosphor sheet-forming resin composition contains a film-forming resin composition and a powdery phosphor that emits fluorescence when irradiated with excitation light. The film-forming resin composition contains a hydrogenated styrene-based copolymer, and uses a sulfide-based phosphor as the phosphor. Examples of the hydrogenated styrene-based copolymer include hydrogenated products of styrene-ethylene-butylene-styrene block (Continued)

copolymers. CaS:Eu is used as a preferred sulfide-based phosphor.

14 Claims, 2 Drawing Sheets

(51) Int. Cl.
  *C09K 11/77* (2006.01)
  *C08L 53/02* (2006.01)
(52) U.S. Cl.
  CPC ......... *C09K 11/7731* (2013.01); *H01L 33/501* (2013.01); *H01L 33/505* (2013.01); *Y10T 428/31692* (2015.04); *Y10T 428/31855* (2015.04)
(58) Field of Classification Search
  USPC ............... 257/98; 313/498–512; 252/301.36; 428/461, 500
  See application file for complete search history.

(56) References Cited

U.S. PATENT DOCUMENTS

| | | | |
|---|---|---|---|
| 6,228,286 B1* | 5/2001 | Leblans et al. | 252/301.4 H |
| 2007/0221865 A1 | 9/2007 | Sohn et al. | |
| 2010/0087584 A1* | 4/2010 | Ono | 524/511 |
| 2010/0246160 A1 | 9/2010 | Ito et al. | |
| 2011/0002140 A1* | 1/2011 | Tsukahara et al. | 362/602 |
| 2011/0045287 A1* | 2/2011 | Kawashima | B32B 17/10018 428/345 |
| 2012/0242220 A1* | 9/2012 | Naganawa et al. | 313/509 |

FOREIGN PATENT DOCUMENTS

| | | |
|---|---|---|
| JP | A-7-508057 | 9/1995 |
| JP | 2004-143352 A | 5/2004 |
| JP | A-2008-41706 | 2/2008 |
| JP | A-2009-40941 | 2/2009 |
| TW | 200942591 A | 10/2009 |
| TW | 201105767 A | 2/2011 |
| TW | 201120183 A | 6/2011 |
| WO | WO 2011/052132 A1 | 5/2011 |
| WO | WO 2011052432 A1 * 5/2011 ............ H05B 33/14 |

OTHER PUBLICATIONS

Nelson et al., "Radioluminescent Polymers: Preparation of Deutero- and Tritopolystyrene," *J. Appl. Polym. Sci.*, Apr. 4, 1991, vol. 42, No. 7, pp. 1801-1806.
International Search Report issued in International Patent Application No. PCT/JP2012/067174 dated Oct. 9, 2012.
Dec. 1, 2015 Office Action issued in Japanese Application No. 2012-151246.
Oct. 19, 2015 Office Action issued in Chinese Application No. 201280033202.5.
Jan. 28, 2015 Office Action issued in Chinese Application No. 201280033202.5.
Feb. 18, 2015 Search Report issued in European Application No. 12807405.1.
Feb. 1, 2016 Office Action issued in Chinese Application No. 201280033202.5.
Jan. 21, 2016 Office Action issued in Taiwanese Application No. 101124365.
Aug. 29, 2016 Office Action issued in Taiwanese Patent Application No. 101124365.

* cited by examiner

PHOSPHOR SHEET-FORMING RESIN COMPOSITION

TECHNICAL FIELD

The present invention relates to a phosphor sheet-forming resin composition containing a film-forming resin composition and a powdery phosphor that emits fluorescence when irradiated with excitation light.

BACKGROUND ART

In one conventional attempt to obtain white light, a phosphor sheet, in which a powdery red phosphor that emits red fluorescence when irradiated with blue light and a green phosphor that emits green fluorescence when irradiated with blue light are dispersed in a resin material having high visible light transmittance, is irradiated with light emitted from a blue light-emitting diode (blue LED) so that red light and green light are caused to be emitted from the phosphor sheet irradiated with the blue light, and then the blue light is mixed with red light and green light to produce white light (Patent Literature 1).

CITATION LIST

Patent Literature

Patent Literature 1: Japanese Patent Application Laid-Open No. 2008-41706

SUMMARY OF INVENTION

Technical Problem

However, in such a phosphor sheet, when a low-cost acrylate-based or methacrylate-based (hereinafter may be abbreviated as (meth)acrylate-based) resin etc. is used as the resin material, the resin material turns yellow due to the blue light, and this causes problems such as a loss of the light power of the blue LED and absorption of the emitted fluorescence. Another problem is that the phosphors deteriorate due to moisture entering the resin material, so that the color of the light emitted from the phosphor sheet changes. Therefore, a silicone resin that has high light fastness and high water vapor permeation resistance but is high cost must be used as the resin material, or the phosphor sheet must be held by high-cost glass substrates from both sides. This poses another problem in that it is difficult to cut down the production cost of the phosphor sheet.

The present invention has been made to solve the foregoing conventional problems, and it is an object of the present invention to provide a phosphor sheet-forming resin composition that uses a low-cost resin material having high light fastness and low visible light absorption and is capable of providing a phosphor sheet at low cost with deterioration of the phosphors due to moisture being suppressed.

Solution to Problem

The present inventors have found that the above object can be achieved by forming the phosphor sheet-forming resin composition from a specific phosphor and a specific film-forming resin composition that has high light fastness and low visible light absorption and is available at low cost. Thus, the present invention has been completed.

Accordingly, the present invention provides a phosphor sheet-forming resin composition containing a film-forming resin composition and a powdery phosphor that emits fluorescence when irradiated with excitation light, wherein
the film-forming resin composition contains a hydrogenated styrene-based copolymer, and
the phosphor contains a sulfide-based phosphor.

The present invention also provides a phosphor sheet including a phosphor layer that emits fluorescence when irradiated with excitation light and a pair of transparent substrates that hold the phosphor layer therebetween, wherein the phosphor layer is obtained by forming the above-described phosphor sheet-forming resin composition of the present invention into a film. The present invention also provides a light-emitting device including the phosphor sheet and an excitation light source that emits excitation light applied to the phosphor sheet.

Advantageous Effects of Invention

In the phosphor sheet-forming resin composition of the present invention, a specific resin composition, among many resin compositions, is used as the film-forming resin composition. The specific resin composition contains a hydrogenated styrene-based copolymer that has higher light fastness and lower visible light absorption than those of (meth)acrylic-based resins etc. and is available at relatively low cost. In addition, a sulfide-based phosphor, among many phosphors, is used as the phosphor. Therefore, the phosphor sheet-forming resin composition of the present invention can provide, at low cost, a phosphor sheet that has high light fastness and low visible light absorption with deterioration of the phosphor due to moisture being suppressed. Even when the phosphor sheet is used for a long time, the degree of deviation in emission wavelength is small, and a reduction in emission spectral intensity is also small.

DESCRIPTION OF EMBODIMENTS

Figure 1:
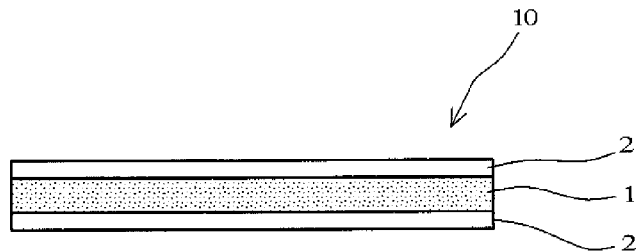
FIG. 1 is a cross-sectional view of a single layer-type phosphor sheet.

The phosphor sheet-forming resin composition of the present invention contains a film-forming resin composition and a powdery phosphor that emits fluorescence when irradiated with excitation light.

The film-forming resin composition contains a hydrogenated styrene-based copolymer. The reason that the hydrogenated styrene-based copolymer is used is that it has higher light fastness and lower water absorption than those of (meth)acrylic-based resins etc. and is available at low cost. Deterioration of the phosphor due to moisture can thereby be prevented.

Preferred examples of the hydrogenated styrene-based copolymer include hydrogenated products of styrene-butadiene-styrene block copolymers, hydrogenated products of styrene-ethylene-butylene-styrene block copolymers, hydrogenated products of styrene-ethylene-propylene-styrene block copolymers, and hydrogenated products of styrene-isoprene-styrene block copolymers. Of these, hydrogenated products of styrene-ethylene-butylene-styrene block copolymers can be particularly preferably used because of their high transparency and gas barrier properties.

If the ratio of the styrene unit contained in the hydrogenated styrene-based copolymer is too low, mechanical strength tends to become low. If the ratio is too high, brittleness tends to become high. Therefore, the ratio of the styrene unit is preferably 10 to 70% by mass and more preferably 20 to 30% by mass.

If the hydrogenation ratio of the hydrogenated styrene-based copolymer is too low, weather resistance tends to deteriorate. Therefore, the hydrogenation ratio is preferably 50% or higher and more preferably 95% or higher.

If the ratio of the hydrogenated styrene-based copolymer contained in the film-forming resin composition is too small, the adhesion thereof becomes insufficient. If the ratio is too large, the film-forming resin composition does not dissolve in a solvent. Therefore, the ratio of the hydrogenated styrene-based copolymer is preferably 10 to 40% by mass and more preferably 20 to 30% by mass.

In the present invention, the phosphor used is a powdery sulfide-based phosphor (with an average particle diameter of generally 3 to 20 μm) that, when irradiated with excitation light, emits fluorescence (fluorescence having a wavelength longer than that of the excitation light). This is because a combination of such a powdery sulfide-based phosphor with the hydrogenated styrene-based copolymer can provide a phosphor sheet-forming resin composition capable of providing at low cost a phosphor sheet that has high light fastness and low visible light absorption with deterioration of the phosphor due to moisture being suppressed. Light having a wavelength that can excite the phosphor used to thereby cause it to emit fluorescence may be appropriately selected as the excitation light. It is generally preferable to use a known blue LED that has a blue fluorescent peak at a wavelength of 440 to 490 nm.

Examples of the sulfide-based phosphor include sulfide-based phosphors, preferably CaS:Eu and SrS:Eu, that have a red fluorescent peak at 620 to 660 nm when irradiated with blue excitation light. Of these, CaS:Eu is preferably used because of its durability.

In the present invention, if the ratio of the phosphor mixed with the film-forming resin composition is small, the amount of the resin component used as the film-forming component increases relatively. Therefore, the thickness of a coating film applied using a coater tends to be thicker than a prescribed thickness. To reduce the thickness, the amount of a volatile solvent must be increased. On the other hand, if the ratio of the phosphor mixed is large, the amount of the resin component decreases relatively. Therefore, the thickness of the coating film tends to be thinner than the prescribed thickness. In addition, since the concentration of the phosphor relative to the resin is high, unevenness in concentration increases if kneading is insufficient. Therefore, the ratio of the phosphor mixed with the film-forming resin composition is preferably 1 to 10 parts by mass based on 100 parts by mass of the film-forming resin composition and more preferably 1 to 6 parts by mass.

If necessary, other light-transmitting resins such as (meth)acrylic-based resins, color pigments, solvents, etc. may be added to the phosphor sheet-forming resin composition of the present invention within a range in which the effects of the invention are not impaired.

The phosphor sheet-forming resin composition of the present invention can be prepared by mixing the film-forming resin composition and the powdery phosphor by a routine method.

Next, a phosphor sheet using the phosphor sheet-forming resin composition of the present invention will be described with reference to the drawings.

As shown in FIG. 1, the phosphor sheet of the present invention is a phosphor sheet 10 in which a single phosphor layer 1 that emits fluorescence when irradiated with excitation light is sandwiched between a pair of transparent substrates 2. The phosphor layer 1 is formed by depositing the above-described phosphor sheet-forming resin composition of the present invention.

Figure 2:
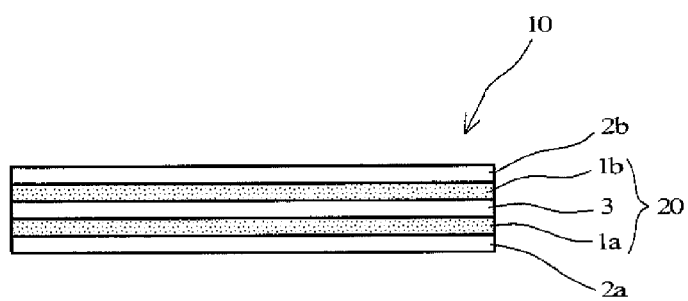
FIG. 2 is a cross-sectional view of a double layer-type phosphor sheet.

FIG. 1 shows an example in which the phosphor layer 1 that is a single layer is used. However, as shown in FIG. 2, a stacked phosphor layer 20 having a double layer structure in which two phosphor layers 1a and 1b are stacked through a transparent separator 3 interposed therebetween may be used. Also in this case, the stacked phosphor layer 20 is sandwiched between a pair of transparent substrates 2a and 2b. In such a double layer structure, phosphors that easily react with each other can be disposed in different layers, and the phosphors and the film-forming resin composition components can be disposed in different layers. Therefore, unintended reactions therebetween can be suppressed, so that the life of the phosphor sheet can be extended. Preferably, in this case, one of the phosphor layers 1a and 1b is formed from a red emitting phosphor sheet-forming resin composition of the present invention containing a sulfide-based phosphor (preferably CaS:Eu) that has a red fluorescent peak at 620 to 660 nm when irradiated with blue excitation light, and the other is formed from a green emitting phosphor sheet-forming resin composition containing any of phosphors, preferably sulfide-based phosphors (particularly $SrGa_2S_4$:Eu), that have a green fluorescent peak at 530 to 550 nm when irradiated with the blue excitation light.

Any of various light-transmitting thermoplastic resins and light-transmitting thermosetting or photocurable resins can be used as the film-forming resin composition constituting the green emitting phosphor sheet-forming resin composition. For example, any of polyolefin resins, (meth)acrylate-based resins, polyester resins, cellulose-based resins, epoxy-based resins, silicone-based resins, and carbonate-based resins can be used. Particularly, it is preferable to form the film-forming resin composition from a polyolefin copolymer component and a maleic anhydride component or from a photocurable (meth)acrylate, as described later.

In the film-forming resin composition formed from a polyolefin copolymer component and a maleic anhydride component, the reason that the polyolefin copolymer component is used is that it has higher light fastness and lower water absorption than those of (meth)acrylic-based resins etc. and is available at low cost. When the film-forming resin composition contains the maleic anhydride component, moisture entering the film-forming resin composition is trapped by free carboxyl groups of the maleic anhydride component, so that deterioration of the phosphor due to moisture can be prevented.

If the ratio of the polyolefin copolymer component contained in the film-forming resin composition is too small, sufficient adhesion tends not to be obtained. If the ratio is too large, the polyolefin copolymer component tends not to dissolve in a solvent. Therefore, the ratio of the polyolefin copolymer component is preferably 10 to 40% by mass and more preferably 20 to 30% by mass.

The maleic anhydride component may be added (externally added) to the polyolefin copolymer component as a separate independent component or may be added (internally added) to the polyolefin copolymer component so as to be graft-polymerized therewith. When the maleic anhydride component is internally added, the film-forming resin composition contains a maleic anhydride-modified polyolefin copolymer. External addition is more preferred than internal addition, because yellowing of the film-forming resin composition can be more suppressed.

When the maleic anhydride component is externally added, if the ratio of the maleic anhydride component to the polyolefin copolymer component contained in the film-forming resin composition is too large, the phosphor sheet tends to be colored. If the ratio is too small, the moisture trapping effect by the maleic anhydride component tends not to be obtained. Therefore, the ratio of the maleic anhydride component contained in the film-forming resin composition is preferably 0.1 to 10 parts by mass based on 100 parts by mass of the polyolefin copolymer component and more preferably 0.1 to 1 part by mass.

When the maleic anhydride component is internally added, if the ratio of the maleic anhydride component contained in the maleic anhydride-modified polyolefin copolymer is too large, the phosphor sheet tends to be colored. If the ratio is too small, the moisture trapping effect by the maleic anhydride component tends not to be obtained. Therefore, the film-forming resin composition contains the maleic anhydride component in the maleic anhydride-modified polyolefin copolymer at a ratio of preferably 0.3 to 30 mol % and more preferably 0.3 to 3 mol %.

Preferred examples of the polyolefin copolymer include styrene-based copolymers and hydrogenated products thereof. Preferred examples of such styrene-based copolymers and hydrogenated products thereof include: styrene-butadiene-styrene block copolymers and hydrogenated products thereof; styrene-ethylene-butylene-styrene block copolymers and hydrogenated products thereof; styrene-ethylene-propylene-styrene block copolymers and hydrogenated products thereof; and styrene-isoprene-styrene block copolymers and hydrogenated products thereof. Of these, hydrogenated products of styrene-ethylene-butylene-styrene block copolymers can be particularly preferably used because of their high transparency and gas barrier properties.

If the ratio of the styrene unit contained in such a styrene-based copolymer is too small, mechanical strength tends to become low. If the ratio is too high, brittleness tends to become high. Therefore, the ratio of the styrene unit is preferably 20 to 30 mold.

If the hydrogenation ratio of the styrene-based copolymer is too low, light fastness tends to deteriorate. Therefore, the hydrogenation ratio is preferably 50% or higher and more preferably 90% or higher.

In the film-forming resin composition formed from a photocurable (meth)acrylate, the reason that the photocurable (meth)acrylate is used is that it has an ester group having the ability to trap moisture. When such a photocurable (meth)acrylate is used, its cured product can trap moisture entering a phosphor sheet, so that deterioration of the phosphor due to moisture can be further prevented.

Examples of such a photocurable (meth)acrylate include urethane(meth)acrylate, polyester(meth)acrylate, and epoxy (meth)acrylate.

Of these, urethane(meth)acrylate can be preferably used because of its light fastness.

Preferred examples of the urethane(meth)acrylate include those obtained by esterifying a reaction product of a polyol (preferably a polyether polyol, a polyolefin polyol, a polyester polyol, or a polycarbonate polyol) and a diisocyanate compound (preferably isophorone diisocyanate) with a hydroxyalkyl(meth)acrylate (preferably 2-hydroxypropyl acrylate).

If the amount of the urethane(meth)acrylate contained in the photocurable (meth)acrylate is too small, adhesion tends to become low. Therefore, the urethane(meth)acrylate is contained in an amount of preferably at least 10 parts by mass based on 100 parts by mass of the photocurable (meth)acrylate and more preferably at least 30 parts by mass.

The film-forming resin composition using the photocurable (meth)acrylate generally contains a photopolymerization initiator. Examples of such a photopolymerization initiator include: radical photopolymerization initiators such as alkylphenone-based photopolymerization initiators, acylphosphine oxide-based photopolymerization initiators, titanocene-based photopolymerization initiators, oxime ester-based photopolymerization initiators, and oxyphenyl acetate-based photopolymerization initiators; and cationic photopolymerization initiators such as diazonium-based photopolymerization initiators, iodonium-based photopolymerization initiators, and sulfonium-based photopolymerization initiators. The amount of such a photopolymerization initiator used is preferably 0.1 to 10 parts by mass based on 100 parts by mass of the photocurable (meth)acrylate and more preferably 1 to 10 parts by mass.

If the thicknesses of the phosphor layers 1, 1*a*, and 1*b* are too small, the absolute amounts of the phosphors become small accordingly, so that the light emission intensity tends to be insufficient. On the other hand, if the thicknesses are too large, the target chromaticity is not obtained. Therefore, the thicknesses of the phosphor layers are preferably 20 to 150 μm and more preferably 60 to 120 μm.

Thermoplastic resin films and thermosetting or photocurable resin films having a thickness of 10 to 100 μm can be used as the transparent substrates 2, 2*a*, and 2*b* and the transparent separator 3. Examples of such films include polyester films, polyamide films, polyimide films, polysulfone films, triacetylcellulose films, and polyolefin films.

If necessary, the surfaces of these films may be subjected to a corona discharge treatment, a silane coupling agent treatment, etc., in order to improve adhesion to the phosphor sheet-forming resin composition.

Figure 3:
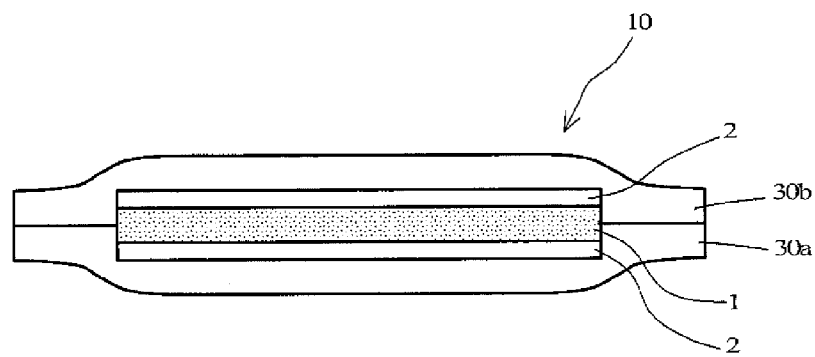
FIG. 3 is a cross-sectional view of a preferred single layer-type phosphor sheet.
Figure 4:
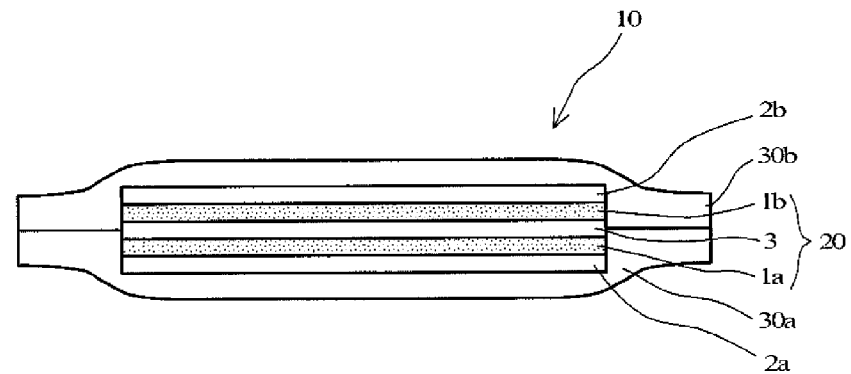
FIG. 4 is a cross-sectional view of a preferred double layer-type phosphor sheet.

In the present invention, it is preferable to seal the phosphor sheets 10 in FIGS. 1 and 2 with two sealing films 30*a* and 30*b* from respective sides, as shown in FIGS. 3 and 4. In this manner, moisture can be further prevented from entering the phosphor layers 1, 1*a*, and 1*b*. In this case, it is preferable to perform sealing such that the side faces of the phosphor sheet 10 are not exposed.

Figure 5:
FIG. 5 is a cross-sectional view of a sealing film.

A film prepared by forming an adhesive layer 32 on a base film 31 as shown in FIG. 5 can be used as each of the sealing films 30*a* and 30*b*. To improve the water vapor barrier properties of the sealing films 30*a* and 30*b*, a silicon oxide layer 33 having a thickness of 5 to 20 nm may be formed on the surface of the base film 31 that faces the adhesive layer 32 or the surface opposite to the adhesive layer 32 by, for example, vapor deposition. In the latter case, a surface protective film 34 may be stacked on the silicon oxide layer 33 through an adhesive layer (not shown).

Any film appropriately selected from the films exemplified for the transparent substrates 2, 2*a*, and 2*b* and the transparent separator 3 described above may be used as each of the base film 31 and the surface protective film 34.

The adhesive layer 32 and the adhesive layer used to stack the surface protective film 34 may be appropriately selected from known adhesives such as urethane-based adhesives and acrylic-based adhesives. The thickness of the adhesive layer 32 is generally 10 to 50 μm.

The single layer-type phosphor sheet 10 of the present invention shown in FIG. 1 can be produced by depositing a phosphor sheet-forming resin composition on a transparent substrate 2 by a routine method to form the phosphor layer 1 and then stacking another transparent substrate 2 thereon. A phosphor sheet 10 having the structure shown in FIG. 3 can be produced by sandwiching the above-produced phosphor sheet 10 between the sealing films 30a and 30b from respective sides such that the adhesive layers 32 face inward and then subjecting the entire product to thermocompression bonding.

The double layer-type phosphor sheet 10 of the present invention shown in FIG. 2 can be produced by depositing a phosphor sheet-forming resin composition of the present invention on a transparent substrate 2a by a routine method to form a phosphor layer 1a, stacking a transparent separator 3 thereon, depositing thereon another phosphor sheet-forming resin composition containing a phosphor different from the phosphor in the previously deposited phosphor sheet-forming resin composition by a routine method to form the phosphor layer 1b, and then stacking the transparent substrate 2b thereon. A phosphor sheet 10 having the structure shown in FIG. 4 can be produced by sandwiching the above-produced phosphor sheet 10 between the sealing films 30a and 30b from respective sides such that the adhesive layers 32 face inward and then subjecting the entire product to thermocompression bonding.

The phosphor sheet of the present invention described above can be preferably used as a phosphor sheet of a light emitting device including the phosphor sheet and an excitation light source for emitting excitation light applied to the phosphor sheet. The configuration of other components constituting such an optical device (for example, a light diffusing member) may be the same as the configuration of a known optical device (refer to FIG. 6 in Japanese Patent Application Laid-Open No. 2010-225373). This light emitting device itself can be used as a lighting device. The light emitting device can also be used as a backlight of a liquid crystal display device.

EXAMPLES

The present invention will next be specifically described by way of Examples.

Example 1

Production of Single Layer-Type Phosphor Sheet (Preparation of Red Phosphor Sheet-Forming Resin Composition)

100 parts by mass of toluene and 40 parts by mass of a hydrogenated styrene-ethylene-butylene-styrene block (hydrogenated SEBS) copolymer (SEPTON V9827, KURARAY Co., Ltd.) were uniformly mixed. Then 4 parts by mass of CaS:Eu (a sulfide-based red phosphor) having an average particle diameter of 9 μm was uniformly dispersed in the obtained mixture to thereby prepare a red emitting phosphor sheet-forming resin composition.

(Production of Phosphor Sheet Having Structure in FIG. 1)

The phosphor sheet-forming resin composition was applied to a 25 μm-thick polyethylene terephthalate film (T11, TORAY INDUSTRIES, Inc.) to a dry thickness of 25 μm and subjected to a drying treatment (100° C., 5 minutes) to form a phosphor layer. A 38 μm-thick polyethylene terephthalate film (A4300, TOYOBO Co., Ltd.) was stacked on the phosphor layer and a thermocompression bonding treatment (100° C., 0.2 MPa) was performed thereon to thereby obtain a phosphor sheet having the structure in FIG. 1.

(Production of Sealing Films)

A polyolefin-based adhesive layer (SEPTON V9827, KURARAY Co., Ltd.) having a thickness of 20 to 25 μm was formed on one side of a 25 μm-thick polyethylene terephthalate film (T-11, TORAY INDUSTRIES, Inc.). A surface protective film having a urethane-based adhesive layer formed thereon was stacked on the other side of the polyethylene terephthalate film through the urethane-based adhesive layer to thereby produce a sealing film. The surface protective film was produced by forming the urethane-based adhesive layer having a thickness of 1 to 2 μm on a vapor-deposited silicon oxide layer having a thickness of about 20 nm and formed on a 12 μl-thick polyethylene terephthalate film (TECHBARRIER, Mitsubishi Plastics, Inc.). The moisture permeability of the obtained sealing film was 0.3 g/m$^2$·24 hr·atm.

(Production of Phosphor Sheet Having Structure in FIG. 3)

The sealing films were disposed on respective sides of the phosphor sheet having the structure in FIG. 1, and the resultant product was subjected to a thermocompression bonding treatment (100° C., 0.2 Pa) to thereby obtain a phosphor sheet sealed with the sealing films.

Example 2

Production of Double Layer-Type Phosphor Sheet (Preparation of Red Emitting Phosphor Sheet-Forming Resin Composition)

100 parts by mass of toluene and 40 parts by mass of a hydrogenated styrene-ethylene-butylene-styrene block (hydrogenated SEBS) copolymer (SEPTON V9827, KURARAY Co., Ltd.) were uniformly mixed. Then 4 parts by mass of CaS:Eu (a sulfide-based red phosphor) having an average particle diameter of 9 μm was uniformly dispersed in the obtained mixture to thereby prepare a red emitting phosphor sheet-forming resin composition.

(Preparation of Green Emitting Phosphor Sheet-Forming Resin Composition)

0.5 parts by mass of a photopolymerization initiator (DAROCUR 1173, manufacture by BASF) and 1.5 parts by mass of SrGa$_2$S$_4$:Eu (a sulfide-based phosphor) having an average particle diameter of 6 μm were uniformly dispersed in 100 parts by mass of a photocurable urethane methacrylate (ARONIX M1600, TOAGOSEI Co., Ltd.) to thereby prepare a green emitting phosphor sheet-forming resin composition.

(Production of Phosphor Sheet Having Structure in FIG. 2)

The green phosphor sheet-forming resin composition was applied to a 25 μm-thick polyethylene terephthalate film (T11, TORAY INDUSTRIES, Inc.) to a dry thickness of 115 μm and then irradiated with ultraviolet rays (7,000 mJ/cm$^2$) to polymerize the urethane methacrylate, whereby a phosphor layer was formed. A 38 μm-thick transparent separator (polyethylene terephthalate film (A4300, TOYOBO Co., Ltd.)) was stacked on the phosphor layer and subjected to a thermocompression bonding treatment (100° C., 20 Pa). The red phosphor sheet-forming resin composition was applied to the treated transparent separator to a dry thickness of 30 μm and then subjected to a drying treatment (100° C., 5 minutes) to form a phosphor layer. A 25 μm-thick polyethylene terephthalate film was stacked on the phosphor layer, and a thermocompression bonding treatment (100° C., 0.2 MPa) was performed thereon to obtain a phosphor sheet having the structure in FIG. 2.

(Production of Phosphor Sheet Having Structure in FIG. 4)

The same sealing films as those used in Example 1 were disposed on respective sides of the phosphor sheet having the structure in FIG. 2, and a thermocompression bonding treatment (100° C., 0.2 MPa) was performed thereon to obtain a phosphor sheet sealed with the sealing films.

Comparative Example 1

A phosphor sheet-forming resin composition was prepared in the same manner as in Example 1 except that the photocurable urethane methacrylate used in Example 2 was used instead of the hydrogenated SEBS copolymer. Then phosphor sheets having the structures in FIGS. 1 and 3 were produced.

Comparative Example 2

A phosphor sheet-forming resin composition was prepared in the same manner as in Example 2 except that the photocurable urethane methacrylate used in Example 2 was used instead of the hydrogenated SEBS copolymer. Then phosphor sheets having the structures in FIGS. 2 and 4 were produced.

Comparative Example 3

A phosphor sheet-forming resin composition was prepared in the same manner as in Example 1 except that a BMA-GMA copolymer (DF-242, Fujikura Kasei Co., Ltd.) was used instead of the hydrogenated SEBS copolymer in the red emitting phosphor sheet-forming resin composition. Then phosphor sheets having the structures in FIGS. 1 and 3 were produced.

(Evaluation)

For each of the sealed phosphor sheets in the Examples and Comparative Examples, the difference in chromaticity and the light emission spectral intensity ratio were measured and evaluated as follows. The results obtained are shown in TABLE 1.

<Difference in Chromaticity (Deviation in Chromaticity)>

Each of the obtained sealed phosphor sheets was left to stand in an environment of 60° C. and 90% Rh for 500 hours. The difference in chromaticity (JIS 28518) $\Delta u'v'$ before and after the sheet was left to stand was determined and evaluated according to the following criteria.

Rank: Criterion
A: $\Delta u'v' < 0.005$
B: $0.005 \leq \Delta u'v' < 0.010$
C: $0.010 \leq \Delta u'v'$ <Light Emission Spectral Intensity Ratio>

Each of the obtained sealed phosphor sheets was left to stand in an environment of 85° C. and 85% Rh for 48 hours. Then the light emission spectral intensity (SR) was measured before and after the sheet was left to stand using a spectroradiometer (TOPCON SR-3, TOPCON Corporation), and the ratio of the light emission spectral intensity (SR) after the sheet was left to stand to the light emission spectral intensity (SR) before the sheet was left to stand was determined and evaluated according to the following criteria. It is practically desirable that the SR ratio be 0.7 or higher (A rating), and it is practically necessary that the SR ratio be 0.5 or higher (B rating).

Rank: Criterion
A: $0.7 \leq$ SR ratio
B: $0.5 \leq$ SR ratio $< 0.7$
C: SR ratio $< 0.5$

TABLE 1

| | | Example | | Comparative Example | | |
| --- | --- | --- | --- | --- | --- | --- |
| Sheet type | Sheet material | Single layer-type phosphor sheet 1 | Double layer-type phosphor sheet 2 | Single layer-type phosphor sheet 1 | Double layer-type phosphor sheet 2 | Single layer-type phosphor sheet 3 |
| Red phosphor sheet | Red phosphor Main resin component | CaS:Eu Hydrogenated SEBS | CaS:Eu Hydrogenated SEBS | CaS:Eu Photocurable urethane methacrylate | CaS:Eu Photocurable urethane methacrylate | CaS:Eu BMA-GMA |
| Green phosphor sheet | Green phosphor Main resin component | — — | SrGa$_2$S$_4$:Eu Photocurable urethane methacrylate | — — | SrGa$_2$S$_4$:Eu Photocurable urethane methacrylate | — — |
| (Evaluation) | | | | | | |
| Difference in chromaticity | (Value) | — | A (0.0038) | — | C (0.0341) | Not measurable because of considerable peeling of phosphor layer. |
| Light emission spectral intensity ratio | (Value) | B (0.57) | — | C (0.4) | — | |

As can be seen from TABLE 1, in the phosphor sheet in Example 1, the light emission spectral intensity ratio was rated B. Therefore, the phosphor sheet in Example 1 is practically usable. However, in the phosphor sheet in Comparative Example 1, since the photocurable urethane methacrylate was used instead of the hydrogenated SEES copolymer constituting the film-forming resin composition in the red emitting phosphor sheet-forming resin composition, the light emission spectral intensity ratio was rated C.

As can be seen from TABLE 1, in the phosphor sheet in Example 2, the difference in chromaticity was rated A, so that the deviation in chromaticity was small. However, in the phosphor sheet in Comparative Example 2, since the photocurable urethane methacrylate was used instead of the hydrogenated SEES copolymer, the difference in chromaticity was rated C, so that the deviation in color was found to be large.

As can be seen from TABLE 1, in the phosphor sheet in Comparative Example 3, since the BMA-GMA copolymer was used instead of the hydrogenated SEBS copolymer, the adhesion of the phosphor layer was low. Therefore, the phosphor layer was peeled off the polyethylene terephthalate films, and the measurement was not possible.

INDUSTRIAL APPLICABILITY

The phosphor sheet-forming resin composition of the present invention uses, as the film-forming resin composition, a specific resin composition selected from many resin compositions and containing a hydrogenated styrene-based copolymer that has high light fastness and low visible light absorption and is available at relatively low cost. In addition, the phosphor sheet-forming resin composition uses, as the phosphor, a sulfide-based phosphor selected from many phosphors. Therefore, the phosphor sheet-forming resin composition of the present invention is useful as a raw material for producing a low cost phosphor sheet that has high light fastness and low visible light absorption with deterioration of the phosphor due to moisture being suppressed.

REFERENCE SIGNS LIST 1, 1a, 1b Phosphor layer
2, 2a, 2b Transparent substrate
3 transparent separator
10 phosphor sheet
20 stacked phosphor layer
30a, 30b Sealing film
31 base film
32 adhesive layer
33 silicon oxide layer
34 Surface protective film

The invention claimed is:

1. A phosphor sheet-forming resin composition comprising a film-forming resin composition and a powdery phosphor that emits fluorescence when irradiated with excitation light, wherein
the film-forming resin composition contains a hydrogenated styrene-based copolymer,
the phosphor contains a sulfide-based phosphor, and
the hydrogenation ratio is 50% or higher in the hydrogenated styrene-based copolymer.

2. The phosphor sheet-forming resin composition according to claim 1, wherein the hydrogenated styrene-based copolymer is a hydrogenated product of a styrene-ethylene-butylene-styrene block copolymer.

3. The phosphor sheet-forming resin composition according to claim 2, wherein a ratio of the styrene unit contained in the styrene-ethylene-butylene-styrene block copolymer is 20 to 30 mol %.

4. The phosphor sheet-forming resin composition according to claim 1, wherein a ratio of the hydrogenated styrene-based copolymer contained in the film-forming resin composition is 20 to 30% by mass.

5. The phosphor sheet-forming resin composition according to claim 1, wherein the phosphor is a sulfide-based phosphor that has a red fluorescent peak at 620 to 660 nm when irradiated with blue excitation light.

6. The phosphor sheet-forming resin composition according to claim 5, wherein the sulfide-based phosphor is CaS:Eu.

7. A phosphor sheet comprising a phosphor layer that emits fluorescence when irradiated with excitation light and a pair of transparent substrates that hold the phosphor layer therebetween, wherein the phosphor layer is obtained by forming the phosphor sheet-forming resin composition according to claim 1 into a film.

8. The phosphor sheet according to claim 7, wherein the phosphor layer has a structure obtained by depositing a red phosphor layer on one side of a transparent separator, the red phosphor layer being formed as a single layer from the phosphor sheet-forming resin composition and depositing a green phosphor layer on the other side of the transparent separator, the green phosphor layer having a green fluorescent peak at 530 to 550 nm when irradiated with blue excitation light.

9. The phosphor sheet according to claim 8, wherein the green phosphor layer contains $SrGa_2S_4$:Eu as the phosphor.

10. The phosphor sheet according to claim 8, wherein the phosphor sheet-forming resin composition in the green phosphor layer further comprises a polyolefin copolymer component and a maleic anhydride component.

11. The phosphor sheet according to claim 10, wherein a concentration of the polyolefin copolymer component in the phosphor sheet-forming resin composition in the green phosphor layer is in the range of 10 to 40% by mass.

12. The phosphor sheet according to claim 7, wherein the phosphor sheet is further sealed with two sealing films from respective sides, the sealing film having an adhesive layer on one side thereof.

13. A light-emitting device comprising: the phosphor sheet according to claim 7; and an excitation light source that emits excitation light applied to the phosphor sheet.

14. The phosphor sheet-forming resin composition according to claim 1, wherein the hydrogenation ratio is 90% or higher in the hydrogenated styrene-based copolymer.

* * * * *